(12) United States Patent
Kim et al.

(10) Patent No.: US 8,030,670 B2
(45) Date of Patent: Oct. 4, 2011

(54) MULTI-CHIP PACKAGE FOR LED CHIP AND MULTI-CHIP PACKAGE LED DEVICE INCLUDING THE MULTI-CHIP PACKAGE

(75) Inventors: Kyoungkook Kim, Suwon-si (KR); Youngsoo Park, Yongin-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 210 days.

(21) Appl. No.: 12/314,738

(22) Filed: Dec. 16, 2008

(65) Prior Publication Data

US 2009/0321776 A1    Dec. 31, 2009

(30) Foreign Application Priority Data

Jun. 25, 2008    (KR) ........................ 10-2008-0060226

(51) Int. Cl.
    *H01L 33/00*    (2010.01)
(52) U.S. Cl. .................... 257/88; 257/99; 257/E33.056; 257/E33.062; 257/E33.066
(58) Field of Classification Search ............... 257/88, 257/99, E33.056, E33.062, E33.066
    See application file for complete search history.

(56) References Cited

U.S. PATENT DOCUMENTS

| | | | | |
|---|---|---|---|---|
| 5,546,496 A * | 8/1996 | Kimoto et al. | ........... | 385/146 |
| 7,055,987 B2 * | 6/2006 | Staufert | ........... | 362/235 |
| 7,728,340 B2 * | 6/2010 | Unno et al. | ........... | 257/98 |
| 7,875,899 B2 * | 1/2011 | Yasuda | ........... | 257/99 |
| 2004/0233671 A1 * | 11/2004 | Staufert | ........... | 362/294 |
| 2005/0073840 A1 * | 4/2005 | Chou et al. | ........... | 362/238 |
| 2005/0158894 A1 * | 7/2005 | Ohba et al. | ........... | 438/22 |
| 2006/0171135 A1 * | 8/2006 | Ishizaka et al. | ........... | 362/11 |
| 2006/0239002 A1 * | 10/2006 | Chou et al. | ........... | 362/249 |
| 2007/0013057 A1 * | 1/2007 | Mazzochette | ........... | 257/723 |
| 2007/0145381 A1 * | 6/2007 | Unno et al. | ........... | 257/79 |
| 2007/0217210 A1 * | 9/2007 | Jeong et al. | ........... | 362/428 |
| 2008/0099772 A1 * | 5/2008 | Shuy et al. | ........... | 257/88 |
| 2008/0179602 A1 * | 7/2008 | Negley et al. | ........... | 257/88 |
| 2008/0211400 A1 * | 9/2008 | Kim et al. | ........... | 313/506 |
| 2008/0211416 A1 * | 9/2008 | Negley et al. | ........... | 315/193 |
| 2008/0217628 A1 * | 9/2008 | Lee et al. | ........... | 257/88 |
| 2009/0108269 A1 * | 4/2009 | Negley et al. | ........... | 257/88 |
| 2009/0166644 A1 * | 7/2009 | Hiroyama et al. | ........... | 257/84 |
| 2009/0236618 A1 * | 9/2009 | Yasuda | ........... | 257/88 |
| 2009/0256494 A1 * | 10/2009 | Nishinaka et al. | ........... | 315/291 |
| 2009/0273925 A1 * | 11/2009 | Schultz et al. | ........... | 362/249.01 |
| 2009/0294780 A1 * | 12/2009 | Chou et al. | ........... | 257/88 |
| 2009/0296395 A1 * | 12/2009 | Tarko et al. | ........... | 362/249.06 |
| 2010/0006873 A1 * | 1/2010 | Raring et al. | ........... | 257/90 |
| 2010/0038662 A1 * | 2/2010 | Fushimi et al. | ........... | 257/98 |
| 2010/0117516 A1 * | 5/2010 | Shimizu et al. | ........... | 313/502 |
| 2010/0176406 A1 * | 7/2010 | Lee | ........... | 257/94 |
| 2010/0213474 A1 * | 8/2010 | Hsu et al. | ........... | 257/89 |
| 2010/0219426 A1 * | 9/2010 | Kim et al. | ........... | 257/88 |
| 2010/0224904 A1 * | 9/2010 | Lee et al. | ........... | 257/99 |
| 2010/0264842 A1 * | 10/2010 | Shimizu et al. | ........... | 315/287 |
| 2010/0308301 A1 * | 12/2010 | Unno et al. | ........... | 257/13 |

* cited by examiner

*Primary Examiner* — Ngan Ngo
(74) *Attorney, Agent, or Firm* — Harness, Dickey & Pierce, P.L.C.

(57) ABSTRACT

Provided is a multi-chip package light emitting diode (LED) device including a plurality of LED chips within a single package. The LED device may include a base substrate, a multi-chip package for a LED on the base substrate, and a light radiator surrounding the multi-chip package and radiating light emitted by the multi-chip package for a LED, wherein the multi-chip package for a LED may include a plurality of LED chips on a single wafer substrate.

13 Claims, 4 Drawing Sheets

MULTI-CHIP PACKAGE FOR LED CHIP AND MULTI-CHIP PACKAGE LED DEVICE INCLUDING THE MULTI-CHIP PACKAGE

PRIORITY STATEMENT

This application claims priority under U.S.C. §119 to Korean Patent Application No. 10-2008-0060226, filed on Jun. 25, 2008, in the Korean Intellectual Property Office (KIPO), the entire contents of which are incorporated herein by reference.

BACKGROUND

1. Field

Example embodiments relate to a multi-chip package for a light-emitting diode (LED) and a LED device including the multi-chip package, and more particularly, to a LED multi-chip package in which a plurality of LED chips may be disposed within a single package, and a LED device including the multi-chip package.

2. Description of the Related Art

Light-emitting diodes (LED) have undergone significant developments since the early 1990s using nitride semiconductor thin-films, and most short wavelength LEDs now use nitride semiconductor thin-films. Specifically, developments in semiconductor growth technologies and device fabricating technologies have improved efficiency of LEDs using the nitride semiconductor thin-films. As a result, nitride-based semiconductor LEDs may be applied to various fields, e.g., light sources of display devices, optical communications, or illuminations. Recently, a nitride-based semiconductor LED having an efficiency of about 120 lm/W or higher has been developed. Such nitride-based semiconductor LEDs have sufficient efficiency to replace conventional light sources, e.g., lamps.

Recently, due to the above-described developments in LEDs, light sources using LEDs are being developed for home lighting, decorative lighting, or display lighting. LEDs, energy-conserving and environmentally conscious light sources, are regarded as next-generation light sources for lighting. Thus, LEDs are being developed to replace conventional light sources. To use LEDs for lighting, LEDs are required to emit light having the same brightness as conventional light sources. Thus, research is being devoted to improving efficiency of LEDs simultaneously with applying high power to LEDs such that the LEDs emit bright light. Currently, higher power and higher brightness LEDs are being developed with a goal of obtaining light of about 1,000 lumens per LED chip.

However, a problem of such an approach may be applying increased power to a single chip of a LED device for lighting. When relatively high power is applied to a single LED chip, overall light brightness increases. However, light emitting efficiency decreases and heat corresponding to the efficiency loss is generated. Thus, applying increased power to a single LED chip is regarded as a cause of either decreasing the lifespan of the LED chip or diminishing reliability of the LED chip.

Furthermore, to control the generated heat, a cooling fan and a heat sink are required to be included in a LED device for lighting. Thus, the manufacturing costs and the volume of a LED device for lighting increase. Furthermore, LED devices for lighting currently in use are relatively small, and thus, are basically point light sources. This characteristic may not satisfy the requirements for surface light emission.

Generally, the brightness of light emitted by a LED device depends on the amount of power applied to the LED device. Specifically, the driving voltage of a LED device may be between about 3.0 V and about 3.5 V regardless of the size of the LED device. Thus, the brightness of light emitted by the LED device varies according to the electric current applied to the LED device. For example, the brightness of light emitted by the LED increases in proportion to the magnitude of electrical current applied to the LED. However, light emitting efficiency of the LED device may be at its peak when the electric current applied to the LED device is between about 5 mA and about 10 mA, and decreases as the electric current applied to the LED device increases.

In most cases, an electrical current of about 350 mA or more may be applied to high power and high brightness LEDs currently in use for increasing brightness. As a result, light emitting efficiency may be relatively low. Furthermore, part of the applied electric current corresponding to decrease of the light emitting efficiency may be converted to heat, and thus the temperature of a LED chip increases. Therefore, as described above, heat dissipating measures for dissipating heat generated by a LED chip to the outside may be required for conventional LED devices, e.g. heat sinks.

To obtain a LED device with lower heat generation and higher light emitting efficiency, driving a LED device by applying an electrical current corresponding to the maximum light emitting efficiency may be required. However, the brightness of light emitted by the LED may decrease.

SUMMARY

Example embodiments provide a multi-chip package for a light-emitting diode (LED), the multi-chip package having improved light emitting efficiency and generating less heat as compared to conventional LEDs, and a LED device including the multi-chip package. Example embodiments also provide a LED device having a simpler structure as compared to conventional LED devices.

According to example embodiments, a multi-chip package for a light emitting diode (LED) may include a plurality of LED chips on a single wafer substrate.

Each of the LED chips may include the wafer substrate; a first clad layer on the wafer substrate; an active layer partially formed on top surface of the first clad layer; a second clad layer on the active layer; a first electrode partially formed on top surface of the first clad layer; and a second electrode on the second clad layer. According to example embodiments, the plurality of LED chips may share the single wafer substrate and the single first clad layer. Furthermore, the multi-chip package may include a package block including the plurality of LED chips; first and second bonding pads on the package block and connected to an external power source; a first wiring pattern connecting the first bonding pad and the first electrode of each of the LED chips; and a second wiring pattern connecting the second bonding pad and the second electrode of each of the LED chips. The first and second wiring patterns may be on the wafer substrate.

Furthermore, the multi-chip package may include at least two wiring groups each of which may include first and second bonding pads and first and second wiring patterns. In example embodiments, each of the two or more wiring groups may be connected to different LED chips.

According to example embodiments, a light emitting diode (LED) device may include a base substrate; a multi-chip package for a LED on the base substrate; and a light emitter surrounding the multi-chip package and emitting light generated in the multi-chip package for a LED, wherein the multi-chip package for a LED may include a plurality of LED chips on a single wafer substrate.

According to example embodiments, some or all of the plurality of LED chips may be turned on or off simultaneously. According to example embodiments, current density of electric current supplied to each of the LED chips may be between about 0.1 A/cm$^2$ and about 50 A/cm$^2$.

BRIEF DESCRIPTION OF THE DRAWINGS

Example embodiments will be more clearly understood from the following detailed description taken in conjunction with the accompanying drawings. FIGS. 1-5 represent non-limiting, example embodiments as described herein.

FIG. 1 is a sectional view of an example of a chip array structure of a multi-chip packaged LED device according to example embodiments;

FIG. 3 is a sectional view roughly showing the overall structure of a LED device employing multi-chip packages according to example embodiments.

Figure 1:
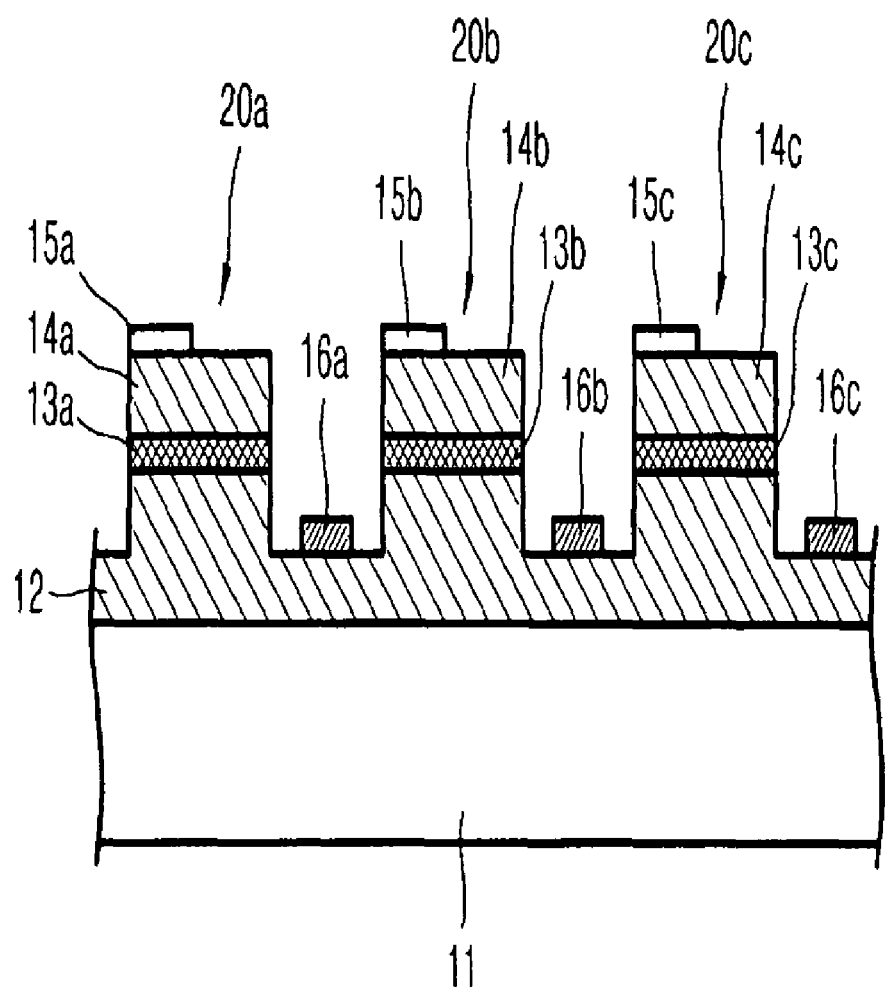

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Hereinafter, a configuration and operations of a multi-chip package for a light emitting diode (LED) and a LED device using the multi-chip package according to example embodiments will be described in detail by explaining example embodiments with reference to the attached drawings. Example embodiments may, however, be embodied in different forms and should not be construed as limited to example embodiments set forth herein. Rather, example embodiments are provided so that this disclosure will be thorough and complete, and will fully convey the scope of example embodiments to those skilled in the art. In the drawings, the thickness of layers and regions are exaggerated for clarity. Like numbers refer to like elements throughout the specification.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Example embodiments suggest a multi-packaging method in which a plurality of LED chips may be disposed within a single package. Conventionally, a method of manufacturing a single LED device may include forming a plurality of LED chips on a semiconductor wafer, dicing the wafer, packaging the LED chips, and combining the LED chip packages with other parts, e.g., heat sinks or lenses. In the conventional art, when LED chips are being packaged, either only a single individually diced LED chip is packaged or a plurality of individually diced LED chips are packaged together. In contrast, example embodiments suggest a method of forming a group of a plurality of LED chips electrically connected to each other while processing a semiconductor wafer and packaging the whole group.

FIG. 1 is a sectional view of an example of a chip array structure of a multi-chip packaged LED device according to example embodiments. Referring to FIG. 1, a plurality of LED chips 20a, 20b, and 20c may be formed on a single wafer substrate 11. According to the method of multi-chip packaging, the plurality of LED chips 20a, 20b, and 20c formed on the single wafer substrate 11 may be packaged together.

Referring to FIG. 1, the structure of the LED chips 20a, 20b, and 20c will now be described in further detail. Each of the LED chips 20a, 20b, and 20c may include the wafer substrate 11 and a first clad layer 12 formed on the wafer substrate 11. The LED chips 20a, 20b, and 20c may respectively include active layers 13a, 13b, and 13c partially formed on the top surface of the first clad layer 12, second clad layers 14a, 14b, and 14c formed on the active layers 13a, 13b, and 13c, first electrodes 16a, 16b, and 16c partially formed on the top surface of the first clad layer 12, and second electrodes 15a, 15b, and 15c partially formed on the second clad layers 14a, 14b, and 14c. The plurality of LED chips 20a, 20b, and 20c may share the wafer substrate 11 and the first clad layer 12. Although three LED chips 20a, 20b, and 20c are illustrated in FIG. 2, example embodiments are not limited thereto, and the number of LED chips may vary if required.

As in other LED chips, the wafer substrate 11 may be formed of an insulator, e.g., glass, silicon dioxide ($SiO_2$), quartz, sapphire ($Al_2O_3$), or AlN, a conductor, e.g., ITO or metals, or a semiconductor, e.g., silicon (Si). Furthermore, the first clad layer 12 may be an n-type semiconductor layer, and the second clad layers 14a, 14b, and 14c may be p-type semiconductor layers. In example embodiments, the first electrodes 16a, 16b, and 16c on top of the first clad layer 12 may be n-type electrodes, whereas the second electrodes 15a, 15b, and 15c may be p-type electrodes. Furthermore, the active layers 13a, 13b, and 13c may be formed of a compound semiconductor, e.g., a Group II-VI oxide, for example, ZnO, MaO, CdO, or MnO, a Group II-VI nitride, for example, GaN, AlN, or InN, or a Group III-V compound, for example, InP, GaAs, or InAs.

Furthermore, if the LED device is a top emission type LED device, the second electrodes 15a, 15b, and 15c may be transparent electrodes, and a reflecting panel (not shown) may be disposed on the wafer substrate 11. In contrast, if the LED device is a bottom emission type LED device, the second electrodes 15a, 15b, and 15c may be reflecting electrodes, and the wafer substrate 11 may be a transparent substrate.

Figure 2A:
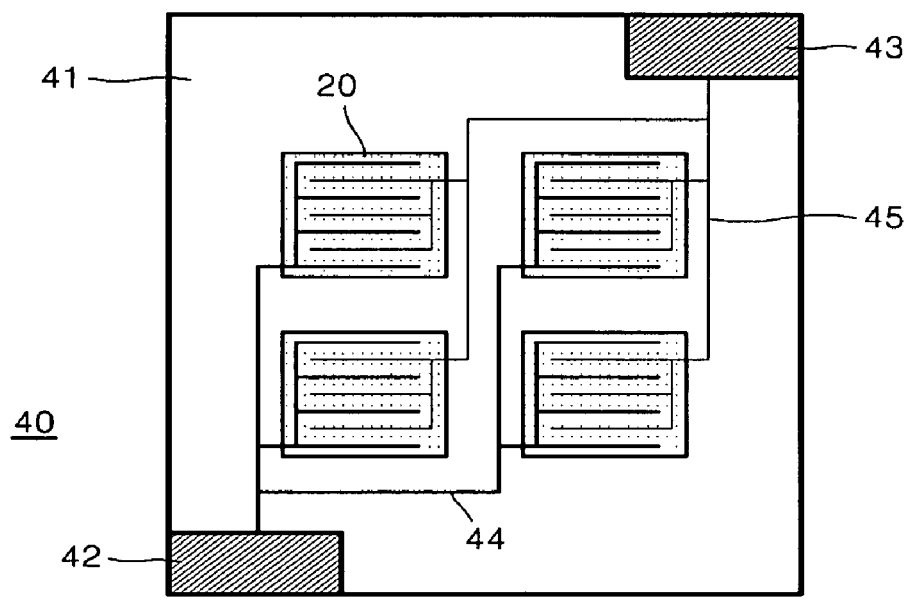
FIGS. 2A-2C is a diagram roughly showing the inside of a multi-chip package, in which a plurality of LEDs are disposed in a package block, for a LED, according to example embodiments.
Figure 2B:
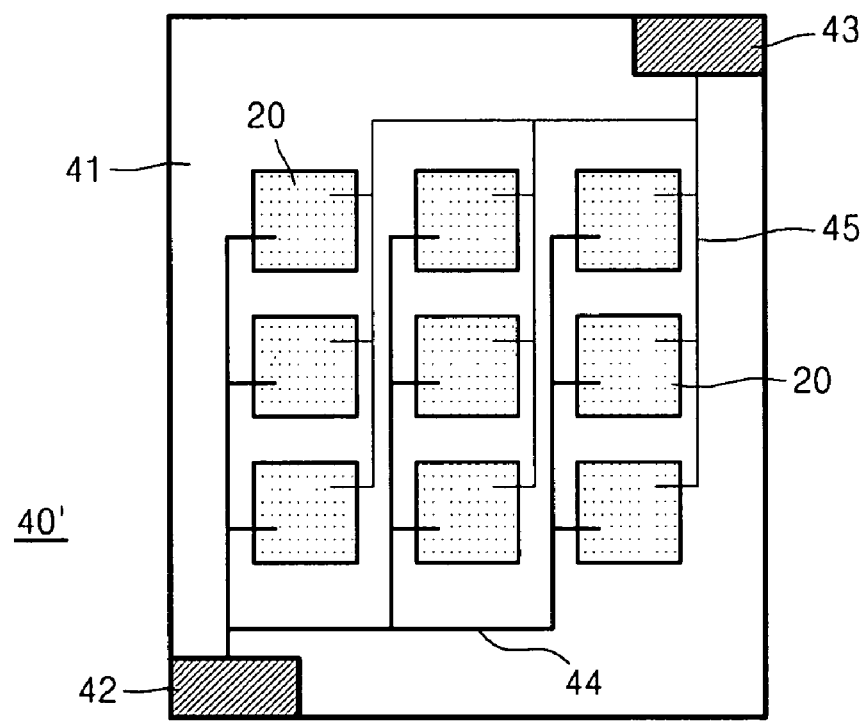
Figure 2C:
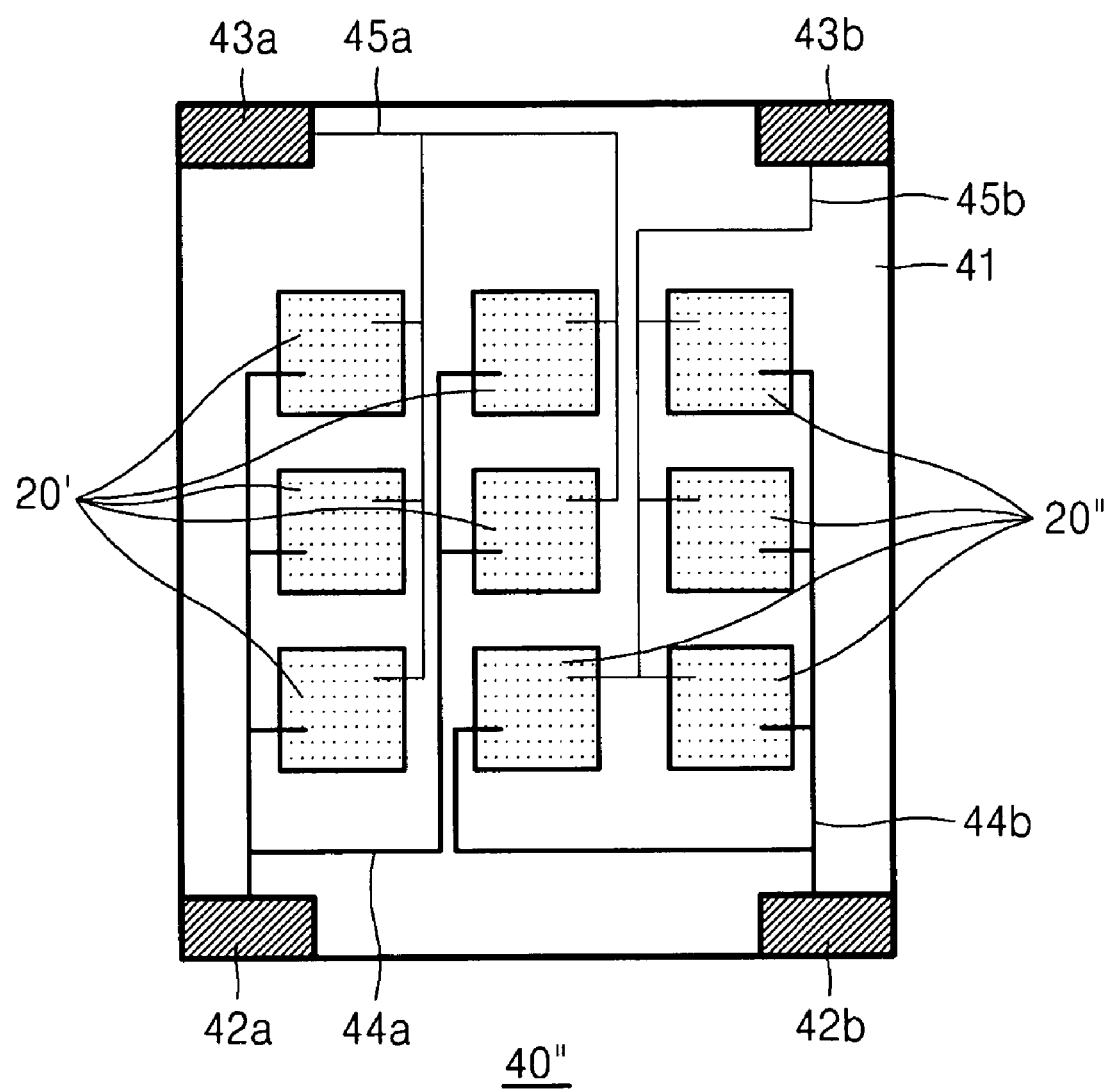

Referring to FIGS. 2A-2C, example embodiments provide a single multi-chip package in which a plurality of LEDs are arranged. FIGS. 2A and 2B respectively show examples of multi-chip packages 40 and 40', which are fabricated by packaging four LED chips 20 (the multi-chip package 40) and nine LED chips 20 (the multi-chip package 40'), respectively. In FIGS. 2A and 2B, the four LED chips 20 and the nine LED chips 20 respectively share wafer substrates and first clad layers, as illustrated in FIG. 1.

For example, the plurality of LED chips 20 may be disposed inside a package block 41. Each of the plurality of LED chips 20 may be connected to first and second bonding pads 42 and 43, which are connected to an external power source and may supply electric current to the LED chips 20, in parallel. For example, the first bonding pad 42 may be connected to a first electrode (refer to FIG. 1) of each of the LED chips 20 via a first wiring pattern 44. Furthermore, the second bonding pad 43 may be connected to a second electrode (refer to FIG. 1) of each of the LED chips 20 via a second wiring pattern 45. The first and second bonding pads 42 and 43 may be formed on the wafer substrate together with the LED chips 20 while processing a wafer.

In the structure of example embodiments, the current density of electric current supplied to each of the LED chips 20 may be maintained between about 0.1 A/cm$^2$ and about 50 A/cm$^2$. Thus, each of the LED chips 20 may be driven with maximum efficiency. In example embodiments, although the brightness of light emitted from each of the LED chips 20 is relatively small, the sum of the brightness of light emitted by the LED chips 20 may be sufficient to be used for lighting due to the combination of the plurality of LED chips 20. Therefore, if the same electric current is supplied as in a conventional high power and high brightness LED device, the multi-chip package LED device according to example embodiments may become brighter due to the improved efficiency. Furthermore, the multi-chip package LED device according to example embodiments may consume less power to obtain the same brightness as light from a conventional high power and high brightness LED due to the improved efficiency. Thus, the heat problem described above may not occur due to the improved efficiency.

Furthermore, the multi-chip package LED device according to example embodiments may prevent or reduce diffusion of electric current, the diffusion occurring in conventional high brightness LED chips. In the case of a conventional high brightness LED chip, the LED chip has a very large chip surface area to increase the brightness of light. Thus, uniformly diffusing electric current throughout the entire chip may be difficult. In contrast, the multi-chip package LED device according to example embodiments may use a plurality of LED chips each of which has a smaller chip surface area. Thus, the diffusion problem may not occur in the multi-chip package LED according to example embodiments. Furthermore, in the multi-chip package LED according to example embodiments, each of the LED chips may not be individually packaged, rather, the plurality of chips may be packaged. Thus, the cost of manufacturing LED devices may be reduced. Furthermore, according to example embodiments, even if some of the LED chips malfunction and do not emit light, the effect on the overall brightness of the multi-chip package LED may be relatively low. Therefore, the lifespan of a light source manufactured by using the multi-chip packaging method may be longer than conventional light.

FIGS. 2A and 2B show that all the LED chips 20 disposed in the single multi-chip packages 40 and 40' are simultaneously turned on or off. However, according to example embodiments, a multi-chip package may be configured such that some of the LED chips in a single multi-chip package may be independently turned on or off. For example, at least two wiring groups, each of which includes at least one each of first and second bonding pads and at least one each of first and second wiring patterns, may be disposed in a single multi-chip package, and each of the two or more wiring groups may be connected to different LED chips.

For example, a multi-chip package 40" illustrated in FIG. 2C may include two first bonding pads 42a and 42b, two second bonding pads 43a and 43b, two first wiring patterns 44a and 44b, and two second wiring patterns 45a and 45b. Among them, the first bonding pad 42a, the second bonding pad 43a, the first wiring pattern 44a, and the second wiring pattern 45a of a first wiring group may be electrically connected to LED chips 20' of a first group.

Furthermore, the first bonding pad 42b, the second bonding pad 43b, the first wiring pattern 44b, and the second wiring pattern 45b of a second wiring group may be electrically connected to LED chips 20" of a second group. In this structure of example embodiments, the LED chips 20' of the first group may be turned on if electric current is supplied to the first wiring group, and the LED chips 20" of the second group may be turned on if electric current is supplied to the second wiring group. Although two wiring groups are illustrated in FIG. 2C as an example, three or more wiring groups may be prepared according to the design of a multi-chip package.

Figure 3:
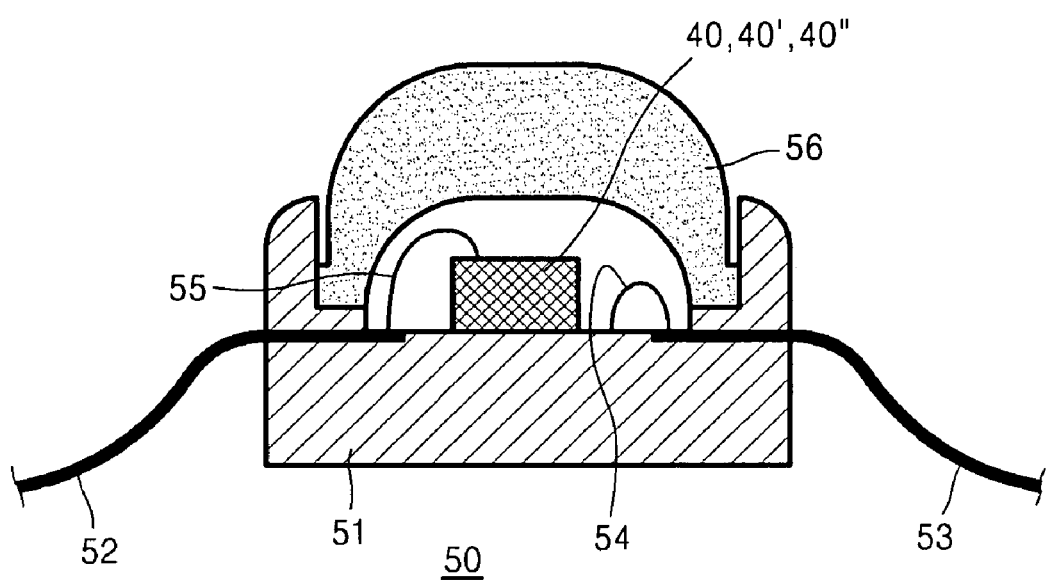

FIG. 3 is a sectional view roughly showing the overall structure of a LED device 50 employing multi-chip packages 40, 40', and 40", according to example embodiments. Referring to FIG. 3, the LED device 50 according to example embodiments may include a base substrate 51, a multi-chip package 40, 40', or 40" for an LED diode which is disposed on the base substrate 51, and a light emitter 56 which surrounds the multi-chip package 40, 40', or 40" and may be for emitting light generated in the multi-chip package 40, 40', or 40" to the outside. Furthermore, leads 52 and 53, which are connected to an external power source and are for supporting the LED device 50, may be disposed on the base substrate 51 of the LED device 50. The leads 52 and 53 may be electrically connected to bonding pads (refer to FIGS. 2A through 2C) of the multi-chip package 40, 40', or 40" via wires 54 and 55. The light emitter 56 may be a lens formed of transparent glass or polymer, for example. Various forms of the light emitter 56 may be well known in the art.

As described above, the LED device 50 according to example embodiments may have improved light emitting efficiency, and thus, problems, e.g., heat generation, seldom occur. Therefore, the LED device 50 may have a simplified structure as illustrated in FIG. 3, because the LED device 50 does not require a heat dissipating structure, for example, a heat sink. Furthermore, a plurality of LED chips may be disposed inside the multi-chip packages 40, 40', and 40" according to example embodiments, and thus, overall surface areas of the multi-chip packages 40, 40', and 40" may increase. Thus, the LED device 50 employing the multi-chip packages 40, 40', and 40" may have more of a surface light emission characteristic than a point light emission characteristic, unlike conventional LED devices.

While example embodiments have been particularly shown and described with reference to example embodiments thereof, it will be understood by those of ordinary skill in the art that various changes in form and details may be made therein without departing from the spirit and scope of the following claims.

What is claimed is:

1. A multi-chip package for a light emitting diode (LED) comprising:
   a plurality of LED chips on a single wafer substrate, the plurality of LED chips being connected to each other in parallel,
   wherein each of the plurality of LED chips includes,
      a first clad layer on the single wafer substrate,
      an active layer partially formed on a top surface of the first clad layer,
      a second clad layer on the active layer,
      a first electrode partially formed on a top surface of the first clad layer, and
      a second electrode on the second clad layer,
   a package block including the plurality of LED chips;
   first and second bonding pads on the package block and connected to an external power source;
   a first wiring pattern connecting the first bonding pad and the first electrode of each of the plurality of LED chips; and
   a second wiring pattern connecting the second bonding pad and the second electrode of each of the plurality of LED chips.

2. The multi-chip package of claim 1, wherein the plurality of LED chips share the single wafer substrate and the first clad layer.

3. The multi-chip package of claim 1, wherein the first and second wiring patterns are on the wafer substrate.

4. The multi-chip package of claim 1, further comprising:
   at least two wiring groups each including the first and second bonding pads and the first and second wiring patterns.

5. The multi-chip package of claim 4, wherein each of the two or more wiring groups is connected to different LED chips.

6. A light emitting diode (LED) device comprising:
   a base substrate;
   a multi-chip package for a LED on the base substrate; and
   a light emitter surrounding the multi-chip package and emitting light generated in the multi-chip package for a LED,
   wherein the multi-chip package for a LED includes,
      a plurality of LED chips on a single wafer substrate, the plurality of LED chips being connected to each other in parallel,
      a package block including the plurality of LED chips,
      first and second bonding pads on the package block and connected to an external power source,
      a first wiring pattern connecting the first bonding pad and the first electrode of each of the plurality of LED chips, and
      a second wiring pattern connecting the second bonding pad and the second electrode of each of the plurality of LED chips, and
   wherein each of the plurality of LED chips includes,
      a first clad layer on the single wafer substrate,
      an active layer partially formed on a top surface of the first clad layer,
      a second clad layer on the active layer,
      a first electrode partially formed on a top surface of the first clad layer, and
      a second electrode on the second clad layer.

7. The LED device of claim 6, wherein the plurality of LED chips share the single wafer substrate and the first clad layer.

8. The LED device of claim 6, wherein the first and second wiring patterns are on the wafer substrate.

9. The LED device of claim 6, wherein the plurality of LED chips are turned on or off simultaneously.

10. The LED device of claim 6, wherein the multi-chip package comprises at least two wiring groups each including the first and second bonding pads and the first and second wiring patterns.

11. The LED device of claim 10, wherein each of the two or more wiring groups is connected to different LED chips.

12. The LED device of claim 11, wherein some of the plurality of LED chips are turned on or off independently.

13. The LED device of claim 6, wherein current density of electric current supplied to each of the LED chips is between about 0.1 A/cm$^2$ and about 50 A/cm$^2$.

* * * * *